US012763754B2

(12) United States Patent
Yang et al.

(10) Patent No.: US 12,763,754 B2
(45) Date of Patent: Oct. 13, 2026

(54) FILM BULK ACOUSTIC RESONATOR

(71) Applicant: AAC ACOUSTIC TECHNOLOGIES (SHENZHEN) CO., LTD., Shenzhen (CN)

(72) Inventors: Shuai Yang, Shenzhen (CN); Ke Wu, Shenzhen (CN); Chao Wang, Shenzhen (CN); Lirong Zhang, Shenzhen (CN); Zhiqiang Zhuang, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 17/919,533

(22) PCT Filed: Aug. 4, 2022

(86) PCT No.: PCT/CN2022/110237

§ 371 (c)(1),
(2) Date: Oct. 18, 2022

(87) PCT Pub. No.: WO2024/007404

PCT Pub. Date: Jan. 11, 2024

(65) Prior Publication Data

US 2025/0125786 A1 Apr. 17, 2025

(30) Foreign Application Priority Data

Jul. 7, 2022 (CN) ......................... 202210853200.6

(51) Int. Cl.
*H03H 9/17* (2006.01)
*H03H 9/02* (2006.01)

(52) U.S. Cl.
CPC ........ *H03H 9/173* (2013.01); *H03H 9/02125* (2013.01); *H03H 9/175* (2013.01)

(58) Field of Classification Search
CPC ..... H03H 9/173; H03H 9/175; H03H 9/02125
See application file for complete search history.

(56) References Cited

U.S. PATENT DOCUMENTS 10,958,236 B2 * 3/2021 Li ...................... H03H 9/02228
2009/0213561 A1 * 8/2009 Mi ...................... H10W 44/501
361/782

(Continued)

OTHER PUBLICATIONS

English Translation of CN 114124024, LV Ping (Year: 2022).*

*Primary Examiner* — Bryan P Gordon
(74) *Attorney, Agent, or Firm* — Wiersch Law Group

(57) ABSTRACT

The present application provides a film bulk acoustic resonator, including a substrate, an acoustic reflection structure arranged on one side of the substrate, a bottom electrode stacked on one side of the acoustic reflection structure, a piezoelectric film covered on the bottom electrode and a top electrode stacked on a side of the piezoelectric film away from the bottom electrode. An interdigital protrusion frame is provided on a side of the top electrode away from the piezoelectric film, and the interdigital protrusion frame includes a first protrusion frame and a second protrusion frame arranged at intervals. The first protrusion frame and the second protrusion frame respectively extend toward each other and overlap each other to form at least a pair of interdigital structures, and each of the interdigital structures includes two forks spaced apart by a preset distance along an overlapping direction.

9 Claims, 9 Drawing Sheets

(56) References Cited

U.S. PATENT DOCUMENTS

| | | | | |
|---|---|---|---|---|
| 2019/0393862 | A1* | 12/2019 | Okada | H03H 9/177 |
| 2023/0163750 | A1* | 5/2023 | Yang | H03H 9/02015<br>310/322 |

* cited by examiner

A-A

FILM BULK ACOUSTIC RESONATOR

TECHNICAL FIELD

The present application relates to the technical field of resonators, in particular to a film bulk acoustic resonator.

BACKGROUND

A film bulk acoustic resonator (FBAR) is a resonator fabricated with a silicon substrate by using a Micro-Electro-Mechanical System (MEMS) technology and a film technology. In a wireless transceiver, the FBAR can realize functions such as image elimination, spurious filtering and channel selection, and has the characteristics of high Q value and easy miniaturization.

Conventional film bulk acoustic resonators usually consist of a bottom electrode, a piezoelectric layer and a top electrode. When a radio frequency electrical signal is applied to the top electrode and the bottom electrode in work, under an action of the inverse piezoelectric effect, the piezoelectric films generate mechanical vibrations in a longitudinal direction and form bulk acoustic waves. Due to the total reflection boundary condition on the surfaces of the upper and lower motors, the propagating bulk acoustic waves will be confined in the transducer, and the bulk acoustic waves with a specific frequency will form a longitudinally propagating standing wave. Under an action of the piezoelectric effect, these bulk acoustic waves are converted into electrical signals, in which an electrical signal converted from bulk acoustic waves with resonant frequencies has the greatest strength, and an electrical signal converted from the bulk acoustic wave with the anti-resonant frequency has the smallest strength, so as to realize the selection of electrical signals with different frequencies. However, due to the boundary electrical conditions and the inclination of a C-axis of the grown piezoelectric layer material, the acoustic waves excited by conventional film bulk acoustic resonators not only include desired longitudinal waves propagating along a thickness direction of the film, but also include transverse parasitic acoustic waves (mainly Rayleigh-Lamb waves) propagating in a horizontal direction of the film. These transverse parasitic acoustic waves carry away the energy of the resonant region when they escape from an edge of a resonant region to an outside of the resonant region, resulting in a reduction in the quality factor (Q value) of the resonator.

SUMMARY

In view of defects of the related art, an object of the present application is to provide a film bulk acoustic resonator, which aims to solve the problem of low quality factor of the related resonator.

In order to achieve the above objects, the present application provides a film bulk acoustic resonator, comprising: a substrate, an acoustic reflection structure arranged on one side of the substrate, a bottom electrode stacked on one side of the acoustic reflection structure, a piezoelectric film covered on the bottom electrode; and a top electrode stacked on a side of the piezoelectric film away from the bottom electrode;

wherein an interdigital protrusion frame is provided on a side of the top electrode away from the piezoelectric film, and the interdigital protrusion frame comprises a first protrusion frame and a second protrusion frame arranged at intervals; the first protrusion frame and the second protrusion frame respectively extend toward each other and overlap each other to form at least a pair of interdigital structures, and each of the interdigital structures comprises two forks spaced apart by a preset distance along an overlapping direction.

In an embodiment, the interdigital structures comprise a first extending protrusion and a second extending protrusion which are connected to a side of the first protrusion frame close to the second protrusion frame and are arranged at intervals, a third extending protrusion and a fourth extending protrusion which are connected to a side of the second protrusion frame close to the first protrusion frame and are arranged at intervals, wherein the first extending protrusion and the third extending protrusion are spaced apart by the preset distance and overlap to form an interdigital structure, and the second extending protrusion and the fourth extending protrusion are spaced apart.

In an embodiment, the second extending protrusion is arranged directly opposite to and spaced apart from the fourth extending protrusion in an extending direction of the second extending protrusion or the second extending protrusion and the fourth extending protrusion are spaced apart by the preset distance and overlap to form an interdigital structure.

In an embodiment, when the second extending protrusion is arranged directly opposite to and spaced apart from the fourth extending protrusion in the extending direction of the second extending protrusion, the interdigital structure further comprises a connecting protrusion connecting the second extending protrusion and the fourth extending protrusion.

In an embodiment, an end of the second extending protrusion close to the second protrusion frame is bent and extended toward a direction of the first extending protrusion to form a first additional protrusion, and an end of the third extending protrusion close to the first protrusion frame is bent and extended toward a direction of the fourth extending protrusion to form a second additional protrusion; the first additional protrusion and the second protrusion frame are arranged in parallel and overlap with the preset distance to form an interdigital structure, and the second additional protrusion and the first protrusion frame are arranged in parallel and overlap with the preset distance to form an interdigital structure.

In an embodiment, the first extending protrusion and the second extending protrusion are respectively connected to opposite ends of the first protrusion frame along an extending direction of the first protrusion frame, the third extending protrusion and the fourth extending protrusion are respectively connected to a position close to opposite ends of the second protrusion frame along an extending direction of the second protrusion frame, and are located on a space enclosed by the first protrusion frame, the first extending protrusion and the second extending protrusion.

In an embodiment, the preset distance is an integer multiple of a quarter wavelength of a transverse parasitic acoustic wave.

In an embodiment, the acoustic reflection structure is a cavity formed inside the substrate or a cavity formed on a side of the substrate close to the bottom electrode or a Bragg mirror formed on a surface of the substrate; when the acoustic reflection structure is a cavity, a projection of the bottom electrode along a thickness direction of the film bulk acoustic resonator is at least partially located outside the acoustic reflection structure.

In an embodiment, a space region formed by a mutual overlapping of the acoustic reflection structure, the bottom electrode, the piezoelectric film and the top electrode along a thickness direction of the film bulk acoustic resonator is a resonance region, and the interdigital protrusion frame is located in the resonance region and is arranged close to an edge of the resonance region.

In an embodiment, a material of the interdigital protrusion frame is a metal material or a dielectric material or a composite material comprising the metal material and the dielectric material.

In general, compared with the related art, the above technical solutions conceived by the present application have the following beneficial effects.

In the present application, the interdigital protrusion frame is provided, so that a reflection of transverse Rayleigh-Lamb waves can be realized according to a difference of acoustic impedance in different regions, thereby improving the resistances Rp and Qp corresponding to an anti-resonance frequency fp of the resonator. Compared with the traditional annular protrusion frame technology (mainly aimed at one transverse Rayleigh-Lamb acoustic wave), the interdigital protrusion frame technology of the present application can reflect two or more transverse Rayleigh-Lamb acoustic waves to achieve high reflection efficiency, further reducing the energy leaking to an outside of the resonance region, and increasing the resistance Rp and Qp corresponding to the anti-resonant frequency fp of the resonator. In addition, the interdigital protrusion frame is a non-closed loop structure, which is beneficial to the realization of the peeling process, in which the peeling residue phenomenon is not easy to occur after the peeling process is used, thereby ensuring a yield of the resonator without increasing preparation process steps of the resonator.

DETAILED DESCRIPTION OF THE EMBODIMENTS

In order to make the objects, technical solutions and advantages of the present application clearer, the present application will be further described in detail below with reference to the accompanying drawings and embodiments. It should be understood that specific embodiments described herein are only used to explain the present application, but not to limit the present application. In the specific embodiment described herein, a film bulk acoustic resonator (FBAR) with a shape of rectangle is taken as an example, but the shape of the film bulk acoustic resonator is not limited to be a rectangle in practice, and may be other polygonal or elliptical shapes in practice.

Figure 1:
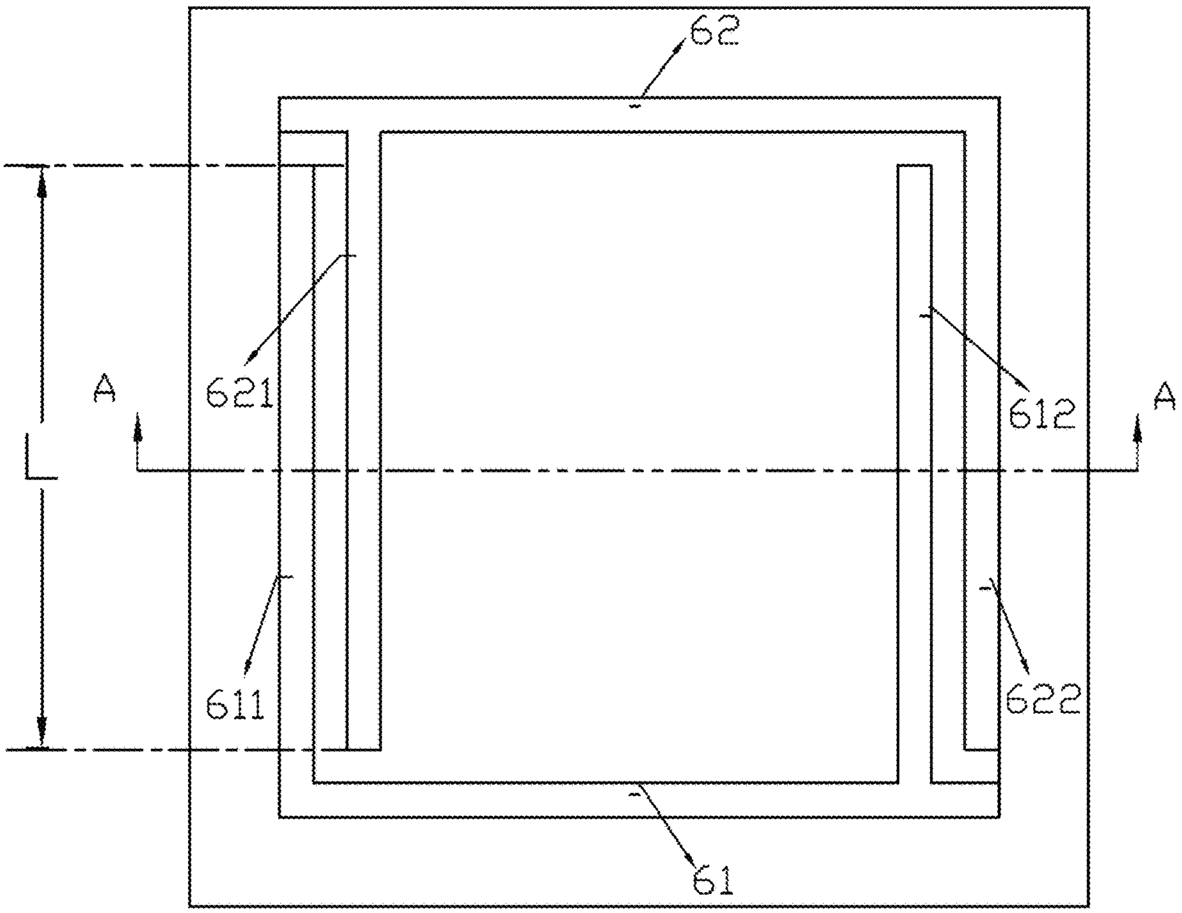
FIG. 1 is a top view of a film bulk acoustic resonator according to a first embodiment of the present application.
Figure 2A:
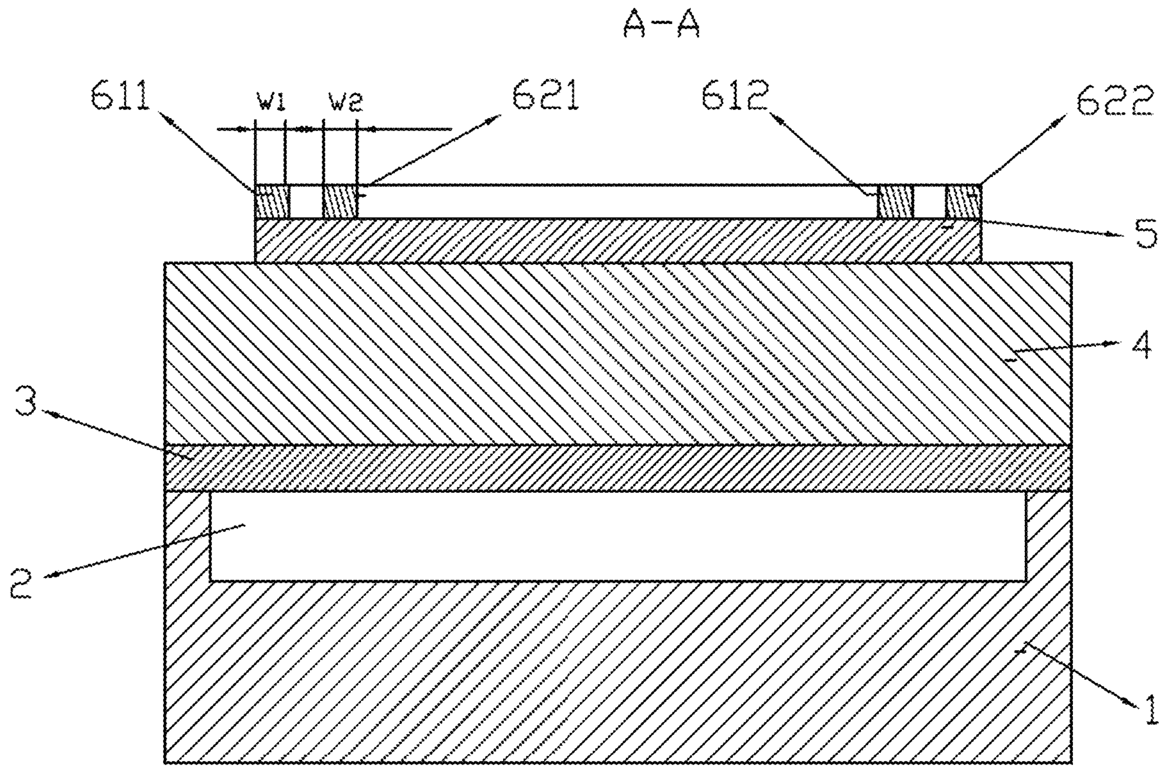
FIG. 2A is a sectional view of a first type of film bulk acoustic resonator along an A-A direction according to the first embodiment of the present application.
Figure 2B:
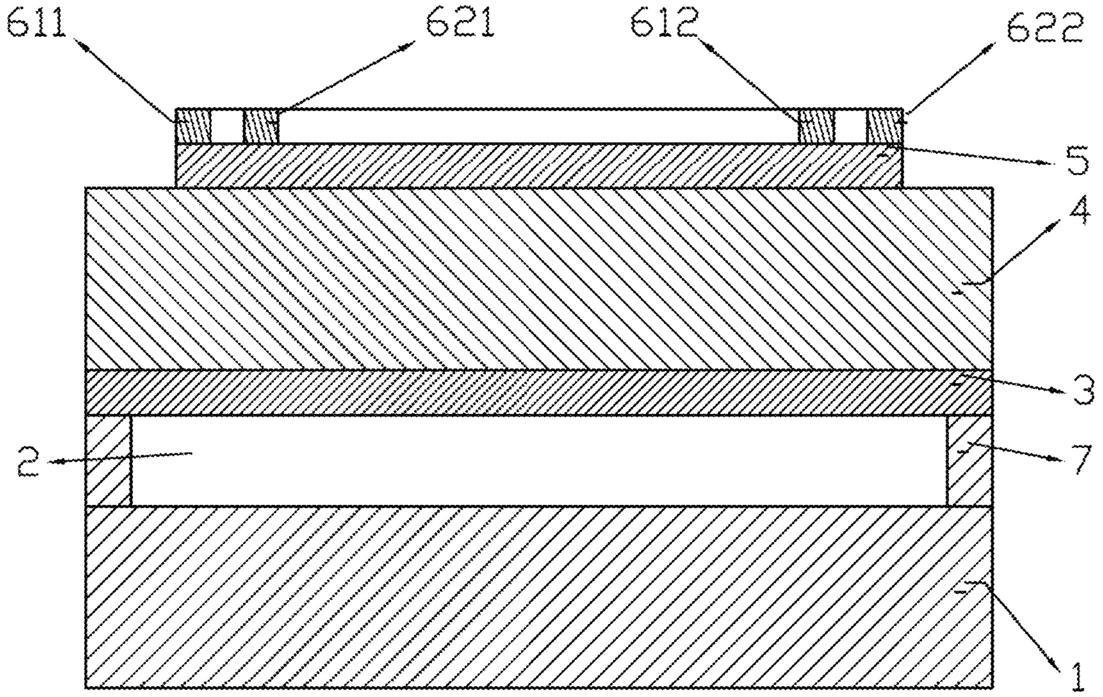
FIG. 2B is a sectional view of a second type of film bulk acoustic resonator along the A-A direction according to the first embodiment of the present application.
Figure 2C:
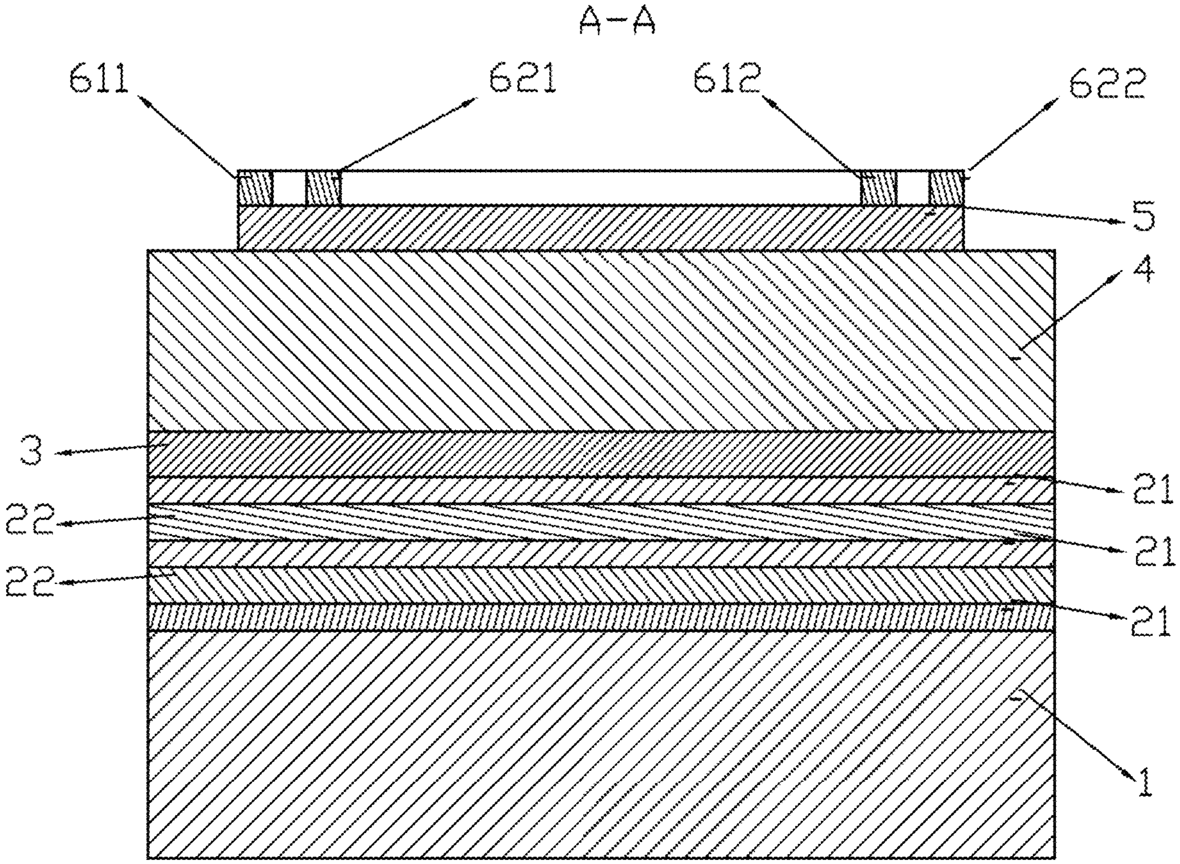
FIG. 2C is a sectional view of a third type of film bulk acoustic resonator along the A-A direction according to the first embodiment of the present application.
Figure 3:
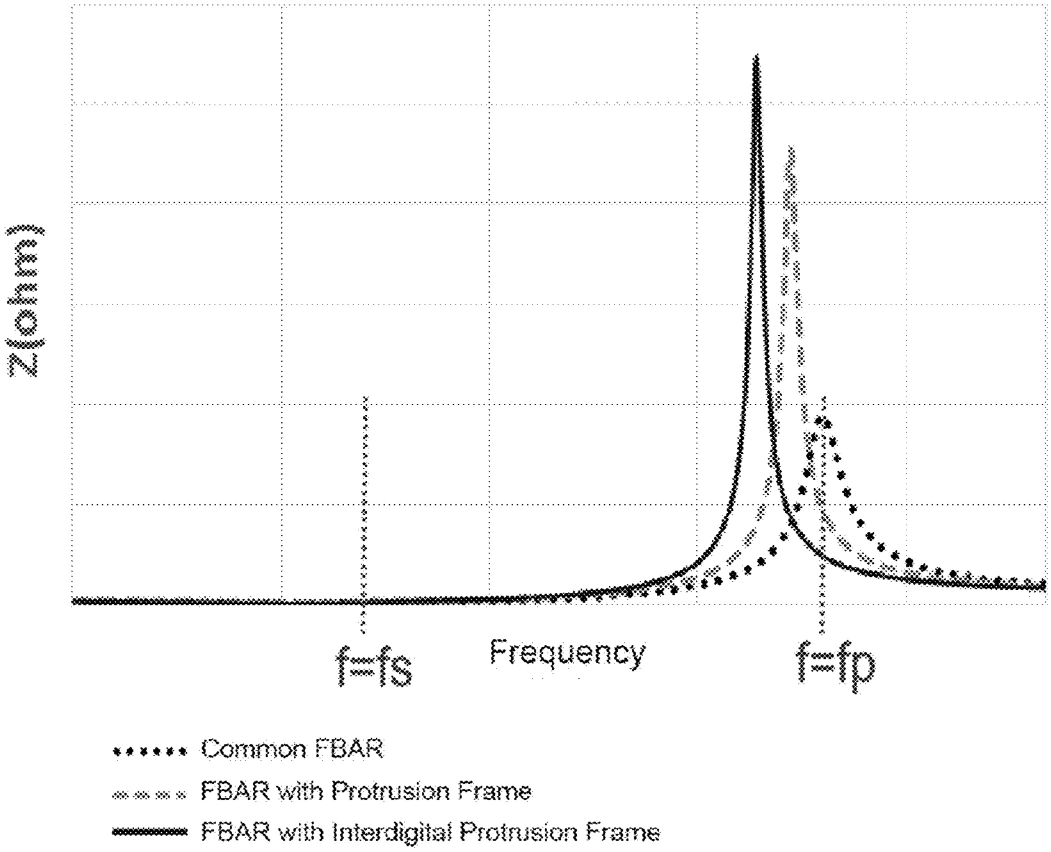
FIG. 3 illustrates an impedance curve comparison diagram between the film bulk acoustic resonator according to the first embodiment of the present application and a film bulk acoustic resonator in the related art.

The present application provides a film bulk acoustic resonator, referring to FIGS. 1 and 2A-2C, the resonator includes a substrate 1, an acoustic reflection structure 2 arranged on one side of the substrate 1, and a bottom electrode 3 stacked on one side of the acoustic reflection structure 2, a piezoelectric film 4 covered on the bottom electrode 3, and a top electrode 5 stacked on a side of the piezoelectric film 4 away from the bottom electrode 3. An interdigital protrusion frame is provided on a side of the top electrode 5 away from the piezoelectric film 4, and the interdigital protrusion frame comprises a first protrusion frame 61 and a second protrusion frame 62 arranged at intervals. The first protrusion frame 61 and the second protrusion frame 61 respectively extend toward each other and overlap each other to form at least a pair of interdigital structures The film bulk acoustic resonator provided by the present application can realize the reflection of the transverse Rayleigh-Lamb waves according to the difference of the acoustic impedance Za in different regions, so as to improve the Q value of the resonator. Compared with the annular protrusion frame technology in the related art, the interdigital structures formed by the interdigital protrusion frame technology can reflect two or more transverse Rayleigh-Lamb acoustic waves to achieve high reflection efficiency, further reducing the energy leaking to an outside of the resonance region, and increasing the resistance Rp and Qp corresponding to the anti-resonant frequency fp of the resonator. FIG. 3 illustrates an impedance curves comparison diagram between the of the FBAR with the interdigital protrusion frame provided by the present application and the common FBAR with the protrusion frame in the related art. A width W1 and a width W2 of the FBAR with the interdigital protrusion frame are respectively designed to be integer multiples of a quarter wavelength of the Rayleigh-Lamb wave acoustic wave in two of four Rayleigh-Lamb wave acoustic wave modes (S0, A0, S1 and A1). It can be seen from the results in FIG. 3 that the Rp of the FBAR with the interdigital protrusion frame provided by the present application is significantly higher than the Rp of the FBAR with the protrusion frame in the related art, which indicates that the interdigital protrusion frame has a higher reflection efficiency for transverse Rayleigh-Lamb acoustic waves, and also indicates that the FBAR with the interdigital protrusion frame has a higher Qp. In addition, the interdigital protrusion frame 6 of the present application is a non-closed loop structure, which is beneficial to improve the problem of peeling residue caused by the closed loop of the traditional protrusion frame without increasing preparation process steps of the resonator.

Further, the interdigital structures comprise a first extending protrusion 611 and a second extending protrusion 612 which are connected to a side of the first protrusion frame 61 close to the second protrusion frame 62 and are arranged at intervals, a third extending protrusion 621 and a fourth extending protrusion 622 which are connected to a side of the second protrusion frame 62 close to the first protrusion frame 61 and are arranged at intervals. The first extending protrusion 611 and the third extending protrusion 621 are spaced apart by the preset distance and overlap to form an interdigital structure, and the second extending protrusion 612 and the fourth extending protrusion 622 are spaced apart.

Further, the second extending protrusion 612 is arranged directly opposite to and spaced apart from the fourth extending protrusion 622 in an extending direction of the second extending protrusion 612 or the second extending protrusion 612 and the fourth extending protrusion 622 are spaced apart by the preset distance and overlap to form an interdigital structure.

Based on the above design ideas, the present application provides design examples of five embodiments.

In the first embodiment of the present application, referring to FIG. 1, the first extending protrusion 611 is connected to an end of the first protrusion frame 61, and the second extending protrusion 612 is connected to the first protrusion frame 61 and has a distance from the other end of the first protrusion frame 61. The third extending protrusion 621 is connected to the second protrusion frame 62 and has a distance from one end of the second protrusion frame 62, and the fourth extending protrusion 622 is connected to the other end of the second protrusion frame 62. Therefore, in this embodiment, the interdigital protrusion frame 6 is centrally symmetrical as a whole. The first extending protrusion 611 and the third extending protrusion 621 overlap with the preset distance to form an interdigital structure, and the second extending protrusion 612 and the fourth extending protrusion 622 overlap with the preset distance to form an interdigital structure.

Figure 4:
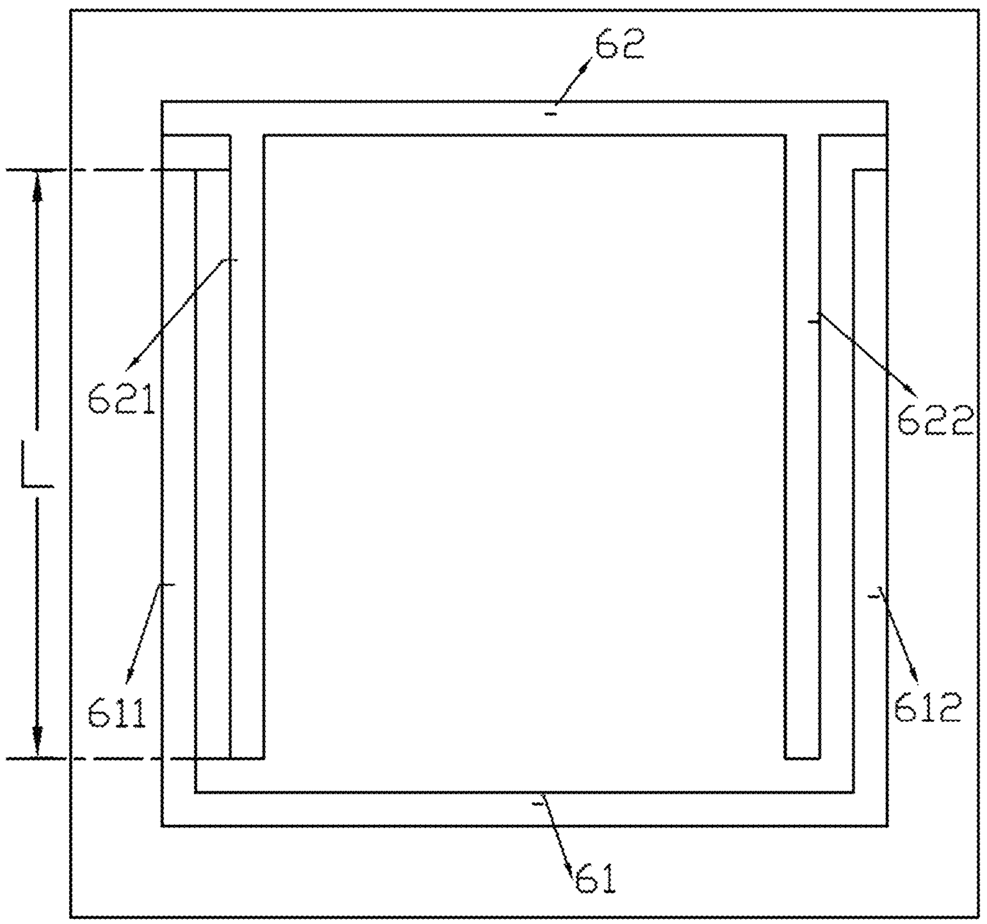
FIG. 4 is a top view of the film bulk acoustic resonator according to a second embodiment of the present application.

In the second embodiment of the present application, referring to FIG. 4, the difference from the first embodiment is that the first extending protrusion 611 and the second extending protrusion 612 are respectively connected to opposite ends of the first protrusion frame 61 along an extending direction of the first protrusion frame 61, the third extending protrusion 621 and the fourth extending protrusion 622 are respectively connected to a position close to opposite ends of the second protrusion frame 62 along an extending direction of the second protrusion frame 62, and are located on a space enclosed by the first protrusion frame 61, the first extending protrusion 611 and the second extending protrusion 612. Specifically, the first extending protrusion 611 is connected to an end of the first protrusion frame 61, and the second extending protrusion 612 is connected to the other end of the first protrusion frame 61. The third extending protrusion 621 is connected to the first protrusion frame 61 and has a distance from one end of the second protruding frame 62, and the fourth extending protrusion 622 is connected to the second protruding frame 62 and has a distance from the other end of the second protruding frame 62. Therefore, for example, from a perspective view of FIG. 4, in this embodiment, the first extending protrusion 611 and the third extending protrusion 621 overlap with the preset distance to form an interdigital structure, and the second extending protrusion 612 and the fourth extending protrusion 622 overlap with the preset distance to form an interdigital structure.

Figure 5:
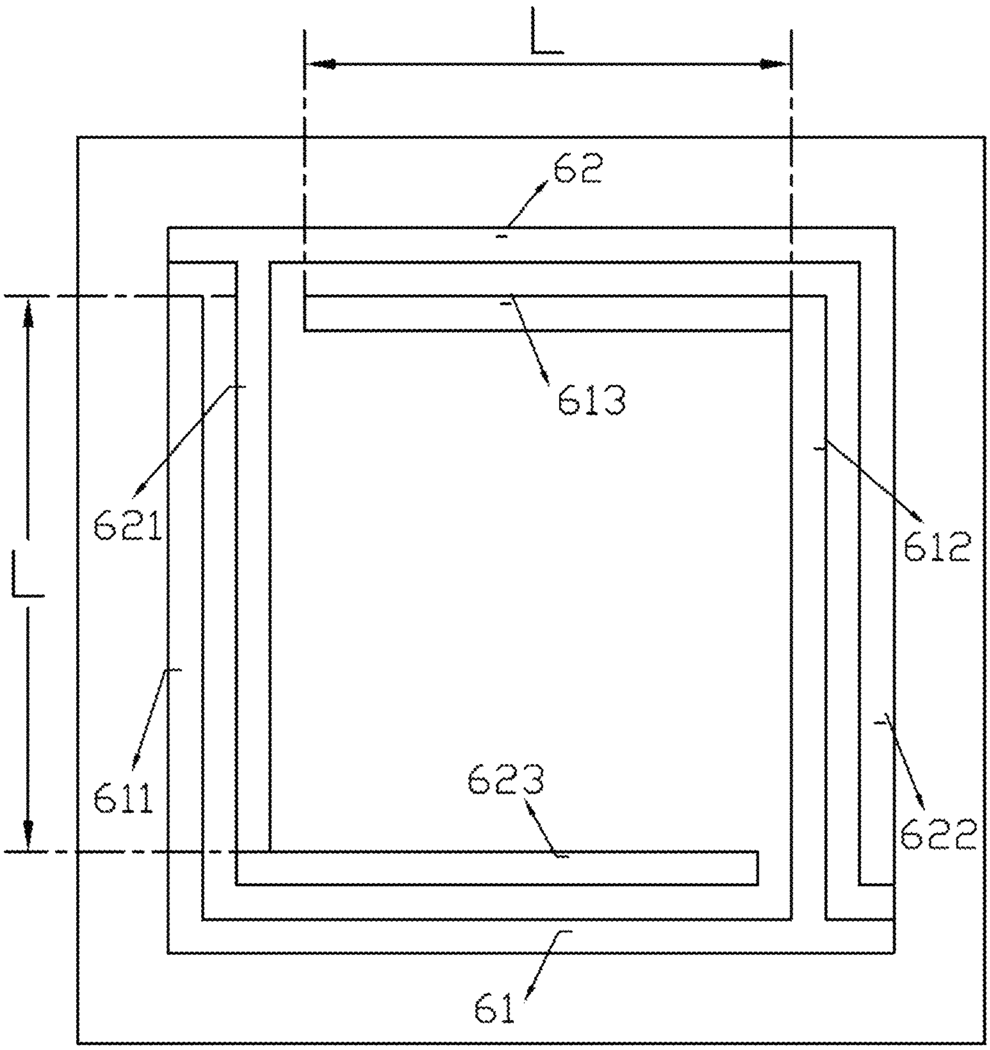
FIG. 5 is a top view of the film bulk acoustic resonator according to a third embodiment of the present application.

In the third embodiment of the present application, referring to FIG. 5, on the basis of the first embodiment, an end of the second extending protrusion 612 close to the second protrusion frame 62 is bent and extended toward a direction of the first extending protrusion 61 to form a first additional protrusion 613, and an end of the third extending protrusion 621 close to the first protrusion frame 61 is bent and extended toward a direction of the fourth extending protrusion 622 to form a second additional protrusion 623. The first additional protrusion 613 and the second protrusion frame 623 are arranged in parallel and overlap with the preset distance to form an interdigital structure, and the second additional protrusion 623 and the first protrusion frame 61 are arranged in parallel and overlap with the preset distance to form an interdigital structure.

Figure 6:
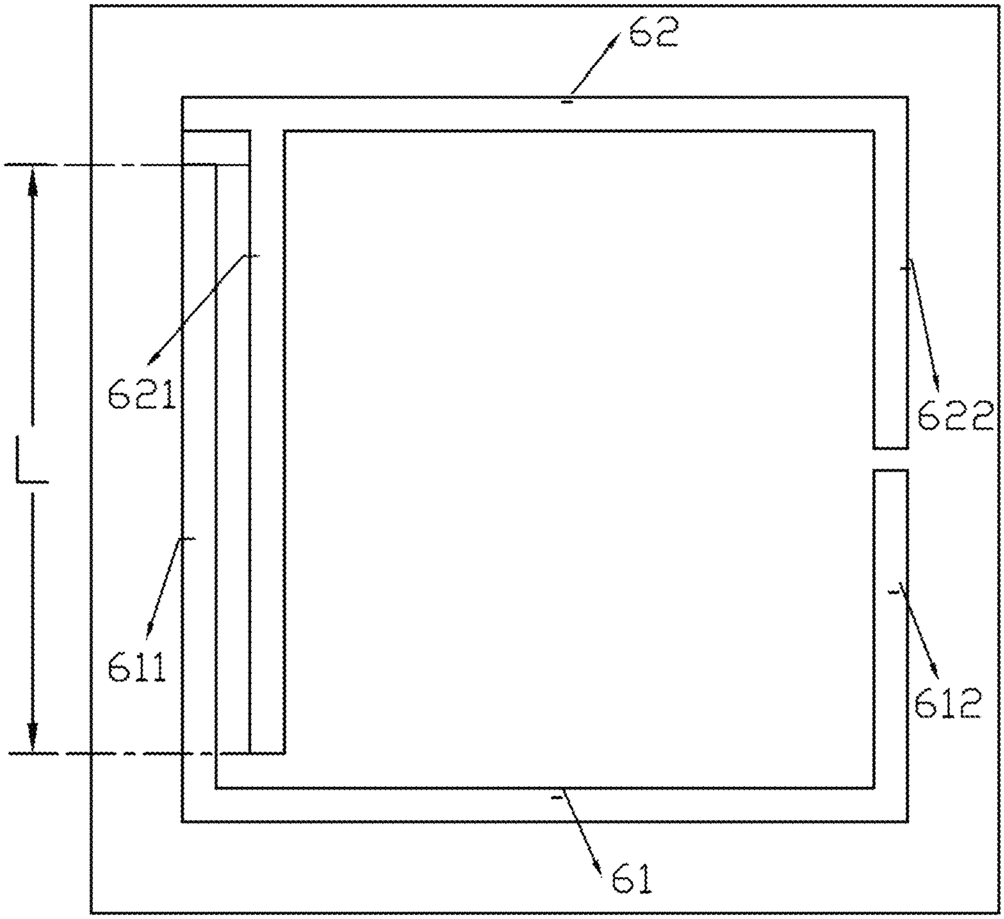
FIG. 6 is a top view of the film bulk acoustic resonator according to a fourth embodiment of the present application.

In the fourth embodiment of the present application, referring to FIG. 6, the difference from the first embodiment is that the first extending protrusion 611 is connected to an end of the first protrusion frame 61, and the second extending protrusion 612 is connected to the other end of the first protrusion frame 61. The third extending protrusion 621 is connected to the second protrusion frame 62 and has a distance from one end of the second protrusion frame 62, and the fourth extending protrusion 622 is connected to the other end of the second protrusion frame. Therefore, in this embodiment, the first extending protrusion 611 and the third extending protrusion 621 overlap with the preset distance to form an interdigital structure, and the second extending protrusion 612 is arranged directly opposite to and spaced apart from the fourth extending protrusion 622 in an extending direction of the second extending protrusion 612.

Figure 7:
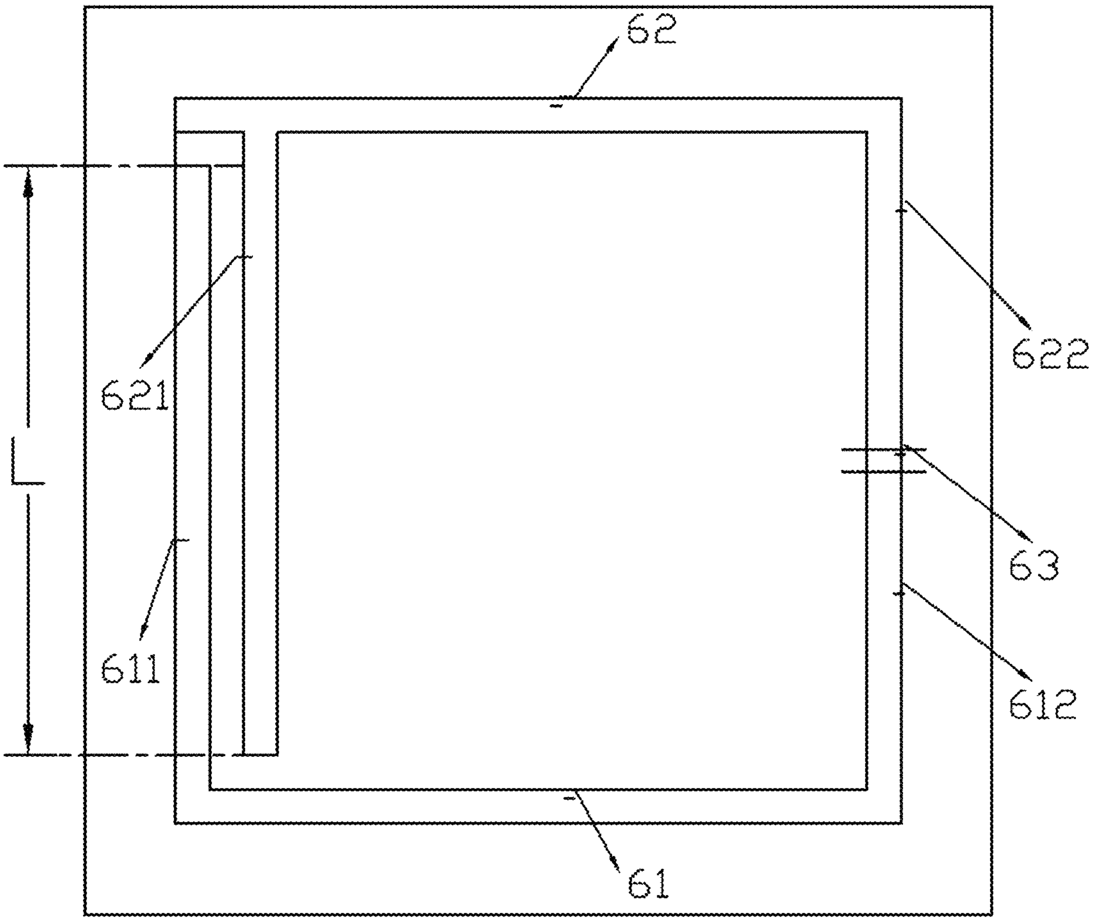
FIG. 7 is a top view of the film bulk acoustic resonator according to a fifth embodiment of the present application.

In the fifth embodiment of the present application, referring to FIG. 7, when the second extending protrusion 612 is arranged directly opposite to and spaced apart from the fourth extending protrusion 622 in an extending direction of the second extending protrusion 612, the interdigital structure further includes a connecting protrusion 63 connecting the second extending protrusion 612 and the fourth extending protrusion 622, that is, this embodiment is: on the basis of the fourth embodiment, the second extending protrusion 612 and the fourth extending protrusion 622 are connected as a whole and extend along the same direction.

Further, in the aforementioned various embodiments, the preset distance is an integer multiple of a quarter wavelength of the transverse parasitic acoustic wave.

Further, the acoustic reflection structure 2 may be a cavity formed inside the substrate 1 or a cavity formed on a side of the substrate 1 close to the bottom electrode 3 or a Bragg mirror formed on a surface of the substrate 1. When the acoustic reflection structure is a cavity, a projection of the bottom electrode 3 along a thickness direction of the film bulk acoustic resonator is at least partially located outside the acoustic reflection structure 2. The acoustic reflection structure 2 in FIG. 2A is a cavity formed inside the substrate 1. The acoustic reflection structure 2 in FIG. 2B is a cavity formed above the substrate 1. In this case, a supporting layer may be provided between the substrate 1 and the bottom electrode 3 to form the cavity. The acoustic reflection structure 2 in FIG. 2C is formed as a Bragg mirror on the surface of the substrate 1. The Bragg mirror includes low-acoustic impedance layers 21 and high-acoustic impedance layers 22 alternately arranged along a thickness direction of the film bulk acoustic resonator. A material of the low-acoustic impedance layer is silicon oxide ($SiO2$), and a material of the high-acoustic impedance layer is metal Wolfram (W), metal Molybdenum (Mo), metal ruthenium (Ru) and iridium (Ir).

Further, a space region formed by a mutual overlapping of the acoustic reflection structure 2, the bottom electrode 3, the piezoelectric film 4 and the top electrode 5 along a thickness direction of the film bulk acoustic resonator is a resonance region, and the interdigital protrusion frame 6 is located in the resonance region and is arranged close to an edge of the resonance region.

Further, a material of the interdigital protrusion frame 6 is a metal material or a dielectric material or a composite material including the metal material and the dielectric material. Specifically, it may be one or more of Al, Pt, Au, W, Mo, Ru, Ir, AlN and $Si_3N_4$.

A width of the interdigital protrusion frame may range from 1 nm to 20000 nm, such as 50 nm, 500 nm, 5000 nm, 10000 nm and 15000 nm. A height thereof may range from 1 nm to 10000 nm, such as 10 nm, 100 nm, 1000 nm, 3000 nm, 5000 nm, 7000 nm and 8000 nm. The widths of the two protrusion frames that make up the interdigital structure may be different or the same. For example, a width of the protrusion frame close to an inner side of the enclosed space is greater than a width of the protrusion frame close to an outer side thereof, and a ratio between the width of the protrusion frame close to the inner side of the enclosed space to a width of the protrusion frame close to the outer side may be in a range of 1.1-2, such as 1.3, 1.5 and 1.7. Of course, the width of the protrusion frame close to the inner side of the enclosed space may also be smaller than the width of the protrusion frame close to the outer side, and the ratio between the width of the protrusion frame close to the inner side of the enclosed space to a width of the protrusion frame close to the outer side may be in a range of 0.5-0.95, such as 0.6, 0.7 and 0.8.

Those skilled in the art can easily understand that the above descriptions are only preferred embodiments of the present application, and are not intended to limit the present application. Any modification, equivalent replacement and improvement made within the spirit and principles of the present application should be included within the protection scope of the present application.

What is claimed is:

1. A film bulk acoustic resonator, comprising:

a substrate;

an acoustic reflection structure arranged on one side of the substrate;

a bottom electrode stacked on one side of the acoustic reflection structure;

a piezoelectric film covered on the bottom electrode; and a top electrode stacked on a side of the piezoelectric film away from the bottom electrode;

wherein an interdigital protrusion frame is provided on a side of the top electrode away from the piezoelectric film, and the interdigital protrusion frame comprises a first protrusion frame and a second protrusion frame arranged at intervals; the first protrusion frame and the second protrusion frame respectively extend toward each other and overlap each other to form at least a pair of interdigital structures, and each of the interdigital structures comprises two forks spaced apart by a preset distance along an overlapping direction; the interdigital structures comprise a first extending protrusion and a second extending protrusion which are connected to a side of the first protrusion frame close to the second protrusion frame and are arranged at intervals, a third extending protrusion and a fourth extending protrusion which are connected to a side of the second protrusion frame close to the first protrusion frame and are arranged at intervals, wherein the first extending protrusion and the third extending protrusion are spaced apart by the preset distance and overlap to form an interdigital structure, and the second extending protrusion and the fourth extending protrusion are spaced apart.

2. The film bulk acoustic resonator of claim 1, wherein the second extending protrusion is arranged directly opposite to and spaced apart from the fourth extending protrusion in an extending direction of the second extending protrusion or the second extending protrusion and the fourth extending protrusion are spaced apart by the preset distance and overlap to form an interdigital structure.

3. The film bulk acoustic resonator of claim 2, wherein when the second extending protrusion is arranged directly opposite to and spaced apart from the fourth extending protrusion in the extending direction of the second extending protrusion, the interdigital structure further comprises a connecting protrusion connecting the second extending protrusion and the fourth extending protrusion.

4. The film bulk acoustic resonator of claim 2, wherein an end of the second extending protrusion close to the second protrusion frame is bent and extended toward a direction of the first extending protrusion to form a first additional protrusion, and an end of the third extending protrusion close to the first protrusion frame is bent and extended toward a direction of the fourth extending protrusion to form a second additional protrusion; the first additional protrusion and the second protrusion frame are arranged in parallel and overlap with the preset distance to form an interdigital structure, and the second additional protrusion and the first protrusion frame are arranged in parallel and overlap with the preset distance to form an interdigital structure.

5. The film bulk acoustic resonator of claim 2, wherein the first extending protrusion and the second extending protrusion are respectively connected to opposite ends of the first protrusion frame along an extending direction of the first protrusion frame, the third extending protrusion and the fourth extending protrusion are respectively connected to a position close to opposite ends of the second protrusion frame along an extending direction of the second protrusion frame, and are located on a space enclosed by the first protrusion frame, the first extending protrusion and the second extending protrusion.

6. The film bulk acoustic resonator of claim 1, wherein the preset distance is an integer multiple of a quarter wavelength of a transverse parasitic acoustic wave.

7. The film bulk acoustic resonator of claim 1, wherein the acoustic reflection structure is a cavity formed inside the substrate or a cavity formed on a side of the substrate close to the bottom electrode or a Bragg mirror formed on a surface of the substrate; when the acoustic reflection structure is a cavity, a projection of the bottom electrode along a thickness direction of the film bulk acoustic resonator is at least partially located outside the acoustic reflection structure.

8. The film bulk acoustic resonator of claim 1, wherein a space region formed by a mutual overlapping of the acoustic reflection structure, the bottom electrode, the piezoelectric film and the top electrode along a thickness direction of the film bulk acoustic resonator is a resonance region, and the interdigital protrusion frame is located in the resonance region and is arranged close to an edge of the resonance region.

9. The film bulk acoustic resonator of claim 1, wherein a material of the interdigital protrusion frame is a metal material or a dielectric material or a composite material comprising the metal material and the dielectric material.

* * * * *